United States Patent [19]

Poletto

[11] Patent Number: 4,843,253
[45] Date of Patent: Jun. 27, 1989

[54] MONOLITHICALLY INTEGRATABLE CIRCUIT FOR THE GENERATION OF EXTREMELY SHORT DURATION CURRENT PULSES

[75] Inventor: Vanni Poletto, Camino, Italy

[73] Assignee: SGS Microelettronica SpA, Agrate Brianza, Italy

[21] Appl. No.: 134,308

[22] Filed: Dec. 15, 1987

[30] Foreign Application Priority Data

Dec. 22, 1986 [IT] Italy ................................ 22799 A/86

[51] Int. Cl.$^4$ .......................... H03K 3/17; H03K 3/01
[52] U.S. Cl. .................................. 307/266; 307/270; 307/246; 328/59
[58] Field of Search ............... 307/270, 475, 246, 265, 307/266; 323/312; 328/59

[56] References Cited

U.S. PATENT DOCUMENTS

| | | | |
|---|---|---|---|
| 3,126,490 | 3/1964 | Stern | 307/270 |
| 3,383,524 | 5/1968 | Garrahan | 307/265 |
| 4,716,313 | 12/1987 | Hori et al. | 307/270 |
| 4,739,190 | 4/1988 | Alzati et al. | 307/270 |

Primary Examiner—John S. Heyman
Assistant Examiner—Richard Roseen
Attorney, Agent, or Firm—Wenderoth, Lind & Ponack

[57] ABSTRACT

A circuit, which may be monolithically integrated, for the generation of current pulses of extremely short duration, includes a differential input structure with first and second PNP transistors. The circuit also includes third, fourth and fifth NPN transistors. The emitter of the third transistor is connected to the negative terminal of a supply voltage source via a first resistor, and to the emitter of the fourth transistor via a first diode and to the emitter of the fifth transistor via a second resistor. The collector of the third transistor is connected to the collector of the second transistor and to the base of the fifth transistor, via a second diode, and to the base of the fourth transistor. The base terminal of the third transistor is connected to the emitter of the fifth transistor via a third resistor and to the negative terminal of the supply voltage source via a capacitor. The collector of the fifth transistor is connected to the positive terminal of the supply voltage source. The collector of the fourth transistor is used as an output terminal of the circuit.

8 Claims, 1 Drawing Sheet

MONOLITHICALLY INTEGRATABLE CIRCUIT FOR THE GENERATION OF EXTREMELY SHORT DURATION CURRENT PULSES

BACKGROUND OF THE INVENTION

The present invention relates to current pulse generator circuits, and in particular to circuits for the generation of current pulses of extremely short duration, which may be used in monolithically integrated devices using bipolar technology with separate power supplies.

The pulse generator circuits which are conventionally used in monolithically integrated devices generally comprise a capacitor whose charging and subsequent discharging are controlled by transistors which operate as switches, switching from a cut-off state to a conductive state and vice versa.

In the conductive state, the transistors operate at saturation in such a way that this state is in effect accurately defined.

A typical example of these pulse generator circuits is incorporated in the monolithically integrated device having the Part No. TDA 7272 produced by SGS Microelettronica S.p.A.

If the components of the circuit are normally dimensioned, current pulses having a duration in the microsecond ($\mu$s) range are obtained.

The most recent embodiments of monolithically integrated circuits for use with telephones, for example, interface circuits between exchange components and subscribers' telephone lines, have led to the problem of inserting known pulse generator circuits in integrated devices having two separate supplies simultaneously, one for circuit components operating with voltages of approximately 50 V and the other for circuit components operating with low voltages of approximately 5 V.

Since in these devices the semiconductor substrate of the integrated circuit is biased to approximately $-50$ V with respect to a reference potential, the presence of transistors at saturation of the pulse generator circuits in circuit components supplied with a low voltage leads, despite the conventional isolation devices, to a considerable supply current absorption which is discharged through the substrate, thereby causing dissipation problems. Circuit and technological devices to prevent this loss of current through the substrate would entail a considerable increase in integration area occupation and a reduction of the speed of operation, i.e. the opposite of the requirements for such telephone circuits.

SUMMARY OF THE INVENTION

The object of the present invention is to provide a circuit for the generation of current pulses of extremely short duration, which can be monolithically integrated using bipolar technology, which can be adapted in an improved way to a wide variety of applications with respect to known circuits.

This object may be achieved by providing a current pulse generator circuit comprising: first and second transistors, each having a first type of conductivity and each having first and second and control terminals, the first terminal of said first transistor and the first terminal of said second transistor being connected together and both connected via a constant current generator to a first terminal of a supply voltage source, the second terminal of said first transistor being connected to a second terminal of said supply voltage source, the control terminal of said first transistor and the control terminal of said second transistor respectively forming first and second input terminals of the circuit; third, fourth and fifth transistors having a second type of conductivity opposite to said first type of conductivity, and each having first and second and control terminals, the first terminal of said third transistor being connected to said second terminal of said supply voltage source via a first resistor, and to the first terminal of said fourth transistor via a first diode and to the first terminal of said fifth transistor via a second resistor, the second terminal of said third transistor being connected via a second diode both to the second terminal of said second transistor and to the control terminal of said fifth transistor and also connected to the control terminal of said fourth transistor, the control terminal of said third transistor being connected to the first terminal of said fifth transistor via a third resistor and to said second terminal of said supply voltage source via a capacitor, the second terminal of said fifth transistor being connected to said first terminal of said supply voltage source and the second terminal of said fourth transistor forming an output terminal of the circuit.

This object may also be achieved by providing a current pulse generator circuit comprising: first and second transistors, each having a first type of conductivity and each having first and second and control terminals, the first terminal of said first transistor and the first terminal of said second transistor being connected together and both connected via a constant current generator to a first terminal of a supply voltage source, the second terminal of said first transistor being connected to a second terminal of said supply voltage source, the control terminal of said first transistor and the control terminal of said second transistor respectively forming first and second input terminals of the circuit; third and fourth transistors having a second type of conductivity opposite to said first type of conductivity, and each having first and second and control terminals, the first terminal of said third transistor being connected to said second terminal of said supply voltage source via a first resistor, and to the first terminal of said fourth transistor via a diode and to the second terminal of said second transistor via a second resistor, the second terminal of said third transistor also being connected to the second terminal of said second transistor and to the control terminal of said fourth transistor, the control terminal of said third transistor being connected to the second terminal of said second transistor via a third resistor and to said second terminal of said supply voltage source via a capacitor, the second terminal of said fourth transistor forming an output terminal of the circuit.

BRIEF DESCRIPTION OF THE DRAWINGS

The invention is illustrated in further detail in the following description given, purely by way of non-limiting example, with reference to the attached drawings, in which.

Figure 1:
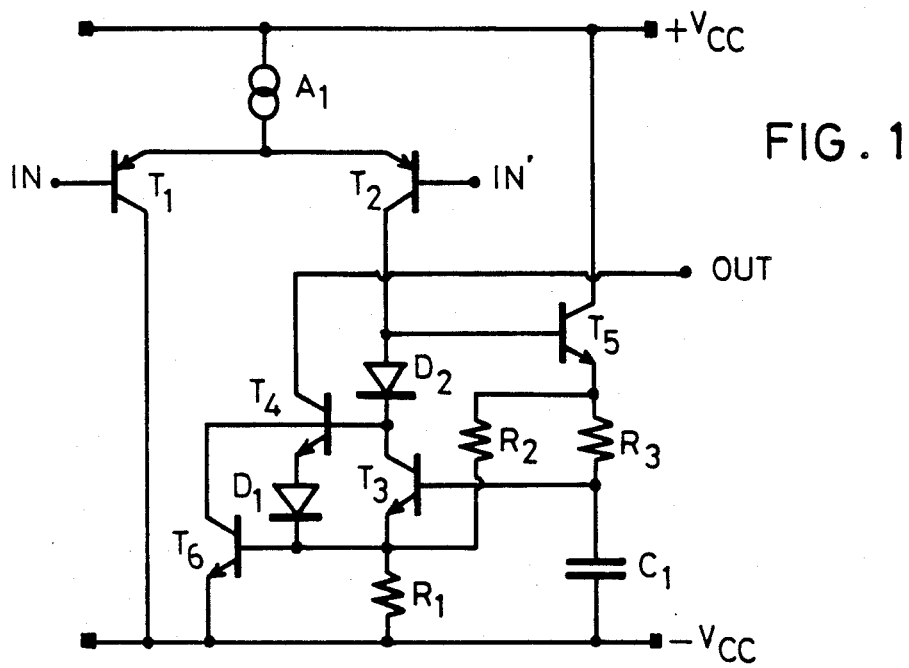
FIG. 1 is a diagram of a preferred embodiment of a current pulse generator circuit in accordance with the present invention.
Figure 2:
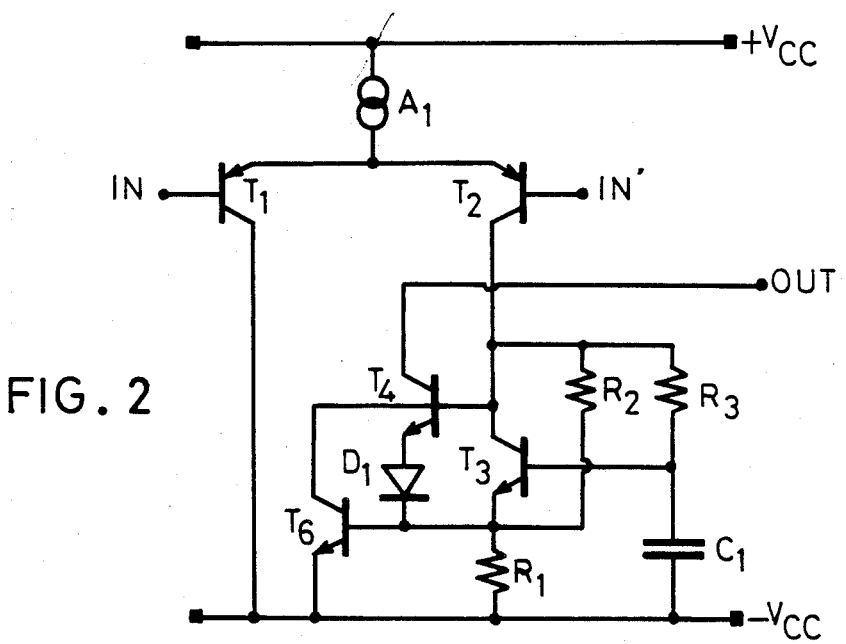
FIG. 2 is a diagram of an embodiment of a current pulse generator circuit in accordance with the present invention which is simplified with respect to the embodiment of FIG. 1.

The same reference letters and numerals have been used in FIGS. 1 and 2 for corresponding components.

DESCRIPTION OF THE PREFERRED EMBODIMENT

The current pulse generator circuit shown in FIG. 1 comprises first and second bipolar PNP transistors $T_1$ and $T_2$, whose emitter terminals are both connected to the positive terminal $+V_{cc}$ of a supply voltage source via a constant current generator $A_1$.

The base terminal of the transistors $T_1$ and the base terminal of the transistor $T_2$ respectively form first and second input terminals IN and IN' of the circuit.

The collector terminal of the transistor $T_1$ is connected to the negative terminal $-V_{cc}$ of the supply voltage source.

The circuit also comprises third, fourth, fifth and sixth bipolar NPN transistors $T_3$, $T_4$, $T_5$ and $T_6$, and first and second diodes $D_1$ and $D_2$.

The emitter terminal of the transistor $T_3$ is connected to the negative terminal $-V_{cc}$ via a first resistor $R_1$, to the emitter terminal of the transistor $T_4$ via the diode $D_1$, to the emitter terminal of the transistor $T_5$ via a second resistor $R_2$ and to the base terminal of the transistor $T_6$.

The collector terminal of the transistor $T_3$ is connected, via the diode $D_2$, both to the collector terminal of the transistor $T_2$ and to the base terminal of the transistor $T_5$ and is also connected to the base terminal of the transistor $T_4$ and to the collector terminal of the transistor $T_6$.

The base terminal of the transistor $T_3$ is connected to the emitter terminal of the transistor $T_5$ via a third resistor $R_3$ and to the negative terminal $-V_{cc}$ via a capacitor $C_1$.

The emitter terminal of the transistor $T_6$ is also connected to the negative terminal $-V_{cc}$, while the collector terminal of the transistor $T_5$ is connected to the positive terminal $+V_{cc}$.

The collector terminal of the transistor $T_4$ forms an output terminal (OUT) of the circuit.

The operation of the circuit will now be examined for a conventional type of use.

The base terminal of the transistor $T_2$ is connected to a reference voltage generator (not shown), with a typical value of 1.2 V, while a voltage signal having a rectangular wave shape, which alternates between two values including the reference voltage value, is supplied to the base terminal of the transistor $T_1$. At each leading edge of the signal from the voltage value lower than the higher value the transistor $T_1$, initially conductive, is cut off, while the transistor $T_2$, previously cut off, starts to conduct.

The collector current of the transistor $T_2$ begins to flow directly into the base of the transistor $T_5$ and via the diode $D_2$ into the base of the transistor $T_4$, thereby causing these transistors to conduct.

The emitter current of the transistor $T_4$ which flows into the base of the transistor $T_6$ via the diode $D_1$ causes the conduction of this transistor which begins to absorb, via the transistor $T_2$ and the diode $D_2$, the current generated by the generator $A_1$.

The value of the current passing through the resistor $R_1$ is then equal to $V_{BE6}/R_1$, wherein $V_{BE6}$ is the base-emitter voltage of the transistor $T_6$. This current value determines the amplitude of the current pulse generated by the transistor $T_4$ fed to a load (not shown) connected to the output terminal OUT. The current flowing through the diode $D_1$ is equal, less a negligible current via the resistor $R_2$, to the current set in the resistor $R_1$ by the voltage $V_{BE6}$ of the transistor $T_6$ in conduction.

The capacitor $C_1$, initially discharged, prevents the immediate conduction of the transistor $T_3$.

The capacitor $C_1$, however, immediately begins to be charged with the current flowing through the resistor $R_3$, with the voltage across its terminals rising exponentially towards a value almost equal to that of the voltage supplied to the emitter terminal of the transistor $T_5$ which is roughly equal to the sum of the base-emitter voltages of the transistors $T_4$ and $T_6$ plus the junction voltage of the diode $D_1$.

As soon as the voltage at the terminals of the capacitor $C_1$ reaches a value equal to double a base-emitter voltage of a bipolar transistor in conduction, the transistor $T_3$ starts to conduct and causes the transistor $T_4$ to be cut off by absorbing all the current passing through the diode $D_2$. The transistor $T_6$ also helps to deplete the charge stored in the base of $T_4$. The switching transient of the transistor $T_3$ from the cut off state to the state of full conduction is extremely rapid despite the presence of the capacitor $C_1$ which prevents a rapid variation of the base-emitter voltage of this transistor.

During the conduction transient of the transistor $T_3$, the transistor $T_6$ continues reliably to conduct, while the cut-off transient of the transistor $T_1$ begins, causing a decrease in the flow of current through the diode $D_1$.

Since the current via the resistor $T_1$ must in practice remain constant for the state of conduction of the transistor $T_6$ which sets a voltage equal to its own baseemitter voltage at the terminals of the resistor itself, the transistor $T_3$ is compelled to increase its emitter current to make up for the drop in the current supplied by the transistor $T_4$. In this way both the conduction of the transistor $T_3$ and the cut off of the transistor $T_4$ are accelerated as a result of the positive feedback which is created between the two transistors. It is the rapidity of switching of this pair of transistors, due precisely to their close connection, which enables the circuit to generate pulses of extremely short duration.

As can be readily seen, the passage of time between the leading edge of the input signal and the instant of time in which the transistor $T_3$ begins to conduct is roughly equal to the product of the capacitance of the capacitor $C_1$ times the value of the resistance $R_3$. The achievement of current pulses of very short duration in time can therefore be reconciled with the requirements of monolithic integration of a possible semiconductor device comprising a circuit in accordance with the present invention, since smaller resistance and capacitance values may be used.

The state of the circuit in which the transistor $T_4$ is cut off and the transistors $T_3$ and $T_5$ are conducting continues up to the subsequent trailing edge of the input signal, when the renewed conduction of the transistor $T_1$ and the cut off of the transistor $T_2$ cause, up to the following leading edge of the input signal, the cut off of all of the other transistors of the circuit.

The resistor $T_2$ is designed to bias the transistor $T_5$ when the transistor $T_4$ is cut off, and, together with the resistors $R_1$ and $R_3$, is designed to discharge the capacitor $C_1$ such that the circuit is in the initial state when the input signal supplies a further leading edge.

It should be noted that the transistor $T_6$ is not essential for the operation of the circuit, since its function is chiefly to regulate the amplitude of the current pulses in applications in which this is necessary.

For this reason, the circuit can also be constructed without the transistor $T_6$ and therefore without the associated connections.

When the circuit comprises the transistor $T_6$, the resistor $R_1$ may be dimensioned such that the conduction of the transistor $T_3$ causes the transistor $T_6$ to be cut off as well, although this cut off is not indispensable for the correct operation of the circuit. As can be seen, if a signal with a rectangular wave shape is supplied to the base terminal of the transistor $T_1$, a sequence of pulses corresponding to the leading edges of the input signal is therefore obtained as output.

If, however, the signal is supplied to the base terminal of the transistor $T_2$ and the base terminal of the transistor $T_1$ is connected to a reference voltage generator, a sequence of output pulses corresponding to the trailing edges of the input signal is obviously obtained.

A circuit in accordance with the present invention of the type shown in FIG. 1 may generate, when its components are normally dimensioned, current pulses with a predetermined amplitude of extremely short duration, e.g.—less than 100 nanoseconds (ns).

None of the transistors included in the circuit have to operate at saturation, and the circuit is therefore full adaptability even to integrated devices with dual supplies of the telephone type.

A simplified embodiment of a circuit in accordance with the present invention is shown in FIG. 2.

The transistor $T_5$ and the diode $D_2$ have been eliminated with respect to FIG. 1; the collector terminal of the transistor $T_2$ is directly connected to the base terminal of the transistor $T_4$, to the collector terminal of the transistor $T_3$, to the collector terminal of the transistor $T_6$ and to the resistors $R_2$ and $R_3$.

In this simplified circuit, however, the value of the current generated by the generator $A_1$ must be higher to enable the conduction of the transistor $T_3$, because when the capacitor $C_1$ begins to be charged, and the voltage at its terminals is therefore much lower, a substantial proportion of the current generated by the generator $A_1$ must flow into the resistor $R_3$.

The transistor $T_5$ is not essential for the correct operation of the circuit in this case either and is substantially designed to regulate the amplitude of the pulses.

Although only two embodiments of the present invention have been described and illustrated, it is evident that a number of variants are possible without departing from the scope of the invention.

The types of polarity of the bipolar transistors could, for example, be exchanged, or field effect transistors could be used.

I claim:

1. A current pulse generator circuit comprising: first and second transistors, each having a first type of conductivity and each having first and second and control terminals, the first terminal of said first transistor and the first terminal of said second transistor being connected together and both connected via a constant current generator to a first terminal of a supply voltage source, the second terminal of said first transistor being connected to a second terminal of said supply voltage source, the control terminal of said first transistor and the control terminal of said second transistor respectively forming first and second input terminals of the circuit; third, fourth and fifth transistors having a second type of conductivity opposite to said first type of conductivity, and each having first and second and control terminals, the first terminal of said third transistor being connected to said second terminal of said supply voltage source via a first resistor, and to the first terminal of said fourth transistor via a first diode and to the first terminal of said fifth transistor via a second resistor, the second terminal of said third transistor being connected via a second diode both to the second terminal of said second transistor and to the control terminal of said fifth transistor and also connected to the control terminal of said fourth transistor, the control terminal of said third transistor being connected to the first terminal of said fifth transistor via a third resistor and to said second terminal of said supply voltage source via a capacitor, the second terminal of said fifth transistor being connected to said first terminal of said supply voltage source and the second terminal of said fourth transistor forming an output terminal of the circuit.

2. A current pulse generator circuit as recited in claim 1, further comprising an additional transistor having a conductivity of said second type and having first, second and control terminals, connected respectively to said second terminal of said supply voltage source, and to the second terminal of said third transistor and to the first terminal of said third transistor.

3. A current pulse generator circuit comprising: first and second transistors, each having a first type of conductivity and each having first and second and control terminals, the first terminal of said first transistor and the first terminal of said second transistor being connected together and both connected via a constant current generator to a first terminal of a supply voltage source, the second terminal of said first transistor being connected to a second terminal of said supply voltage source, the control terminal of said first transistor and the control terminal of said second transistor respectively forming first and second input terminals of the circuit; third and fourth transistors having a second type of conductivity opposite to said first type of conductivity, and each having first and second and control terminals, the first terminal of said third transistor being connected to said second terminal of said supply voltage source via a first resistor, and to the first terminal of said fourth transistor via a diode and to the second terminal of said second transistor via a second resistor, the second terminal of said third transistor also being connected to the second terminal of said second transistor and to the control terminal of said fourth transistor, the control terminal of said third transistor being connected to the second terminal of said second transistor via a third resistor and to said second terminal of said supply voltage source via a capacitor, the second terminal of said fourth transistor forming an output terminal of the circuit.

4. A current pulse generator circuit as recited in claim 3, further comprising an additional transistor having a conductivity of said second type and having first, second and control terminals connected respectively to said second terminal of said supply voltage source, and to the second terminal of said third transistor and to the first terminal of said third transistor.

5. A current pulse generator circuit as recited in claim 1, wherein each of said transistors are bipolar transistors, the first, second and control terminals of each being respectively the emitter, collector and base thereof.

6. A current pulse generator circuit as recited in claim 2, wherein each of said transistors are bipolar transistors, the first, second and control terminals of each being respectively the emitter, collector and base thereof.

7. A current pulse generator circuit as recited in claim 3, wherein each of said transistors are bipolar transistors, the first, second and control terminals of each being respectively the emitter, collector and base thereof.

8. A current pulse generator circuit as recited in claim 4, wherein each of said transistors are bipolar transistors, the first, second and control terminals of each being respectively the emitter, collector and base thereof.

* * * * *